United States Patent [19]
Keel et al.

[11] Patent Number: 4,812,750
[45] Date of Patent: Mar. 14, 1989

[54] ENVIRONMENTAL STRESS SCREENING APPARATUS

[75] Inventors: Jerry L. Keel; Thomas M. Hines, both of Harvest; Glen Davis; William E. Parks, both of Madison, all of Ala.

[73] Assignee: Avex Electronics Inc., Huntsville, Ala.

[21] Appl. No.: 101,448

[22] Filed: Sep. 28, 1987

[51] Int. Cl.$^4$ ............................ G01R 1/02; G01R 1/04
[52] U.S. Cl. ..................... 324/158 F; 324/73 R; 324/158 R; 324/158 P; 73/865.6; 312/296
[58] Field of Search ............ 324/158 P, 158 F, 23 R, 324/158 R; 312/31.01, 296, 297; 73/430–432, 865.6; 174/176 F, 176 CT, 17.05; 220/240, 308, 344, 378; 292/311, 318, 240

[56] References Cited

U.S. PATENT DOCUMENTS

| | | | |
|---|---|---|---|
| 3,664,181 | 5/1972 | Conrad et al. | 73/865.6 |
| 4,729,246 | 3/1988 | Melgaard et al. | 73/865.6 |

FOREIGN PATENT DOCUMENTS

| | | | |
|---|---|---|---|
| 0602476 | 4/1957 | Canada | 312/296 |
| 0550335 | 12/1957 | Canada | 312/296 |
| 0568792 | 1/1959 | Canada | 312/296 |
| 0181729 | 5/1986 | European Pat. Off. | 324/158 F |

Primary Examiner—Reinhard J. Eisenzopf
Assistant Examiner—W. Burns
Attorney, Agent, or Firm—Irwin P. Garfinkle

[57] ABSTRACT

The disclosed apparatus provides a universal wheeled cart for carrying electronic devices to be stress tested in a sealed environmental chamber in which the temperature is varied between high and low limits while the power to the electronic components is being turned on and off. The cart is configured to substantially fully occupy the insulated heated chamber which is provided with tracks for the wheels of the cart. In addition to a front access door for admitting the cart, the chamber is provided with a rear rectangular aperture through which a novel rectangular bustle mounted on the cart extends. The bustle support a plurality of connectors through which power is supplied to the electronic devices. Complementary power actuated electrical connectors are mounted in fixed relation to the rear aperture, and when actuated, all power connections to the electronic components are made through the bustle and standardized busses on the cart. A unique removable seal on the bustle provides an insulated closure for the rear aperture. The chamber is provided with conventional heating apparatus.

3 Claims, 5 Drawing Sheets

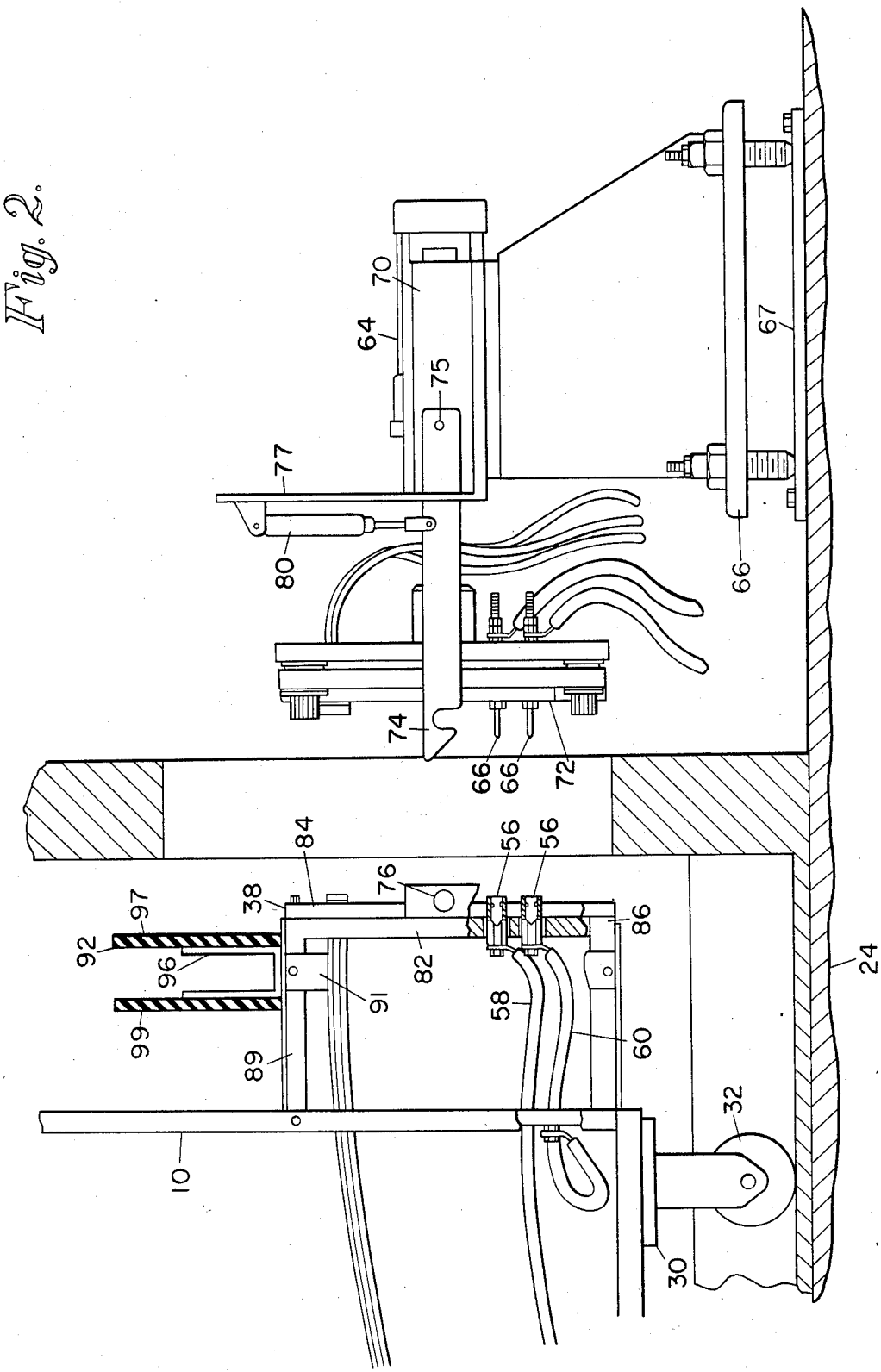

ENVIRONMENTAL STRESS SCREENING APPARATUS

BACKGROUND OF THE INVENTION

This invention relates to a universal, or generic system for environmental stressing and screening of electronic devices such as circuit boards. The devices are placed in a stressing chamber where the temperatures are cycled between high and low limits, while at the same time, the power supplied to the devices is being cycled on and off. This temperature and power cycling stresses and serves to weed out weak components prior to failure in the field.

In prior systems, the process of stressing (or burn in) was performed on a prototype of the device, but as the need for improved reliability increased, it has become common practice to perform stress screening on every component. As a result, the stressing chamber has become very large, and is essentially a walk in room. The carts used to hold the equipment have also become large and complicated, and each cart is custom designed for the particular devices being stressed.

The use of large customized systems is satisfactory for high volume manufacture, but in many high technology applications, products are built in small quantities, and custom design is not economically feasible.

In the prior art systems, every new product required a customized cart to fit the product size, configuration and electrical connection requirements. Therefore, in low quantity manufacture, such tests were either not performed, or the cost of stressing was a very significant factor. In accordance with this invention, 100% environmental stress screening is made economically feasible because the new system allows reconfiguration of the cart for a wide variety of products with minimum requirements for customization.

SUMMARY OF THE INVENTION

In accordance with this invention, an environmental stress screen system is made up of a room sized heat insulated chamber, the interior temperature of which is variable over a predetermined wide range. The chamber, a four wall closed compartment, is provided with a substantially full width and height access door at the its front end, and a relatively small rectangular aperture at its back end. The chamber is provided with a pair of spaced parallel wheel supporting tracks extending from front to back.

A product supporting wheeled cart having dimensions approximating the interior of the chamber is provided with a plurality of standardized busses for carrying electrical current to and from the products. The connections from the busses to the exterior of the chamber are made through a bustle mounted on the back end of the cart. When the cart is in place within the chamber, the bustle projects through the aperture. A unique air seal removably mounted on the bustle provides an insulated closure between the bustle and the walls surrounding the aperture. The electrical connections to the bustle are made by means of a power actuated connector mounted in fixed relation to the chamber and in alignment with the bustle as it passes through the aperture in the chamber.

IN THE DRAWINGS

FIG. 2 is an enlargement of a portion of FIG. 1 showing the bustle disconnected from the power connector;

DESCRIPTION OF THE INVENTION

Figure 1:
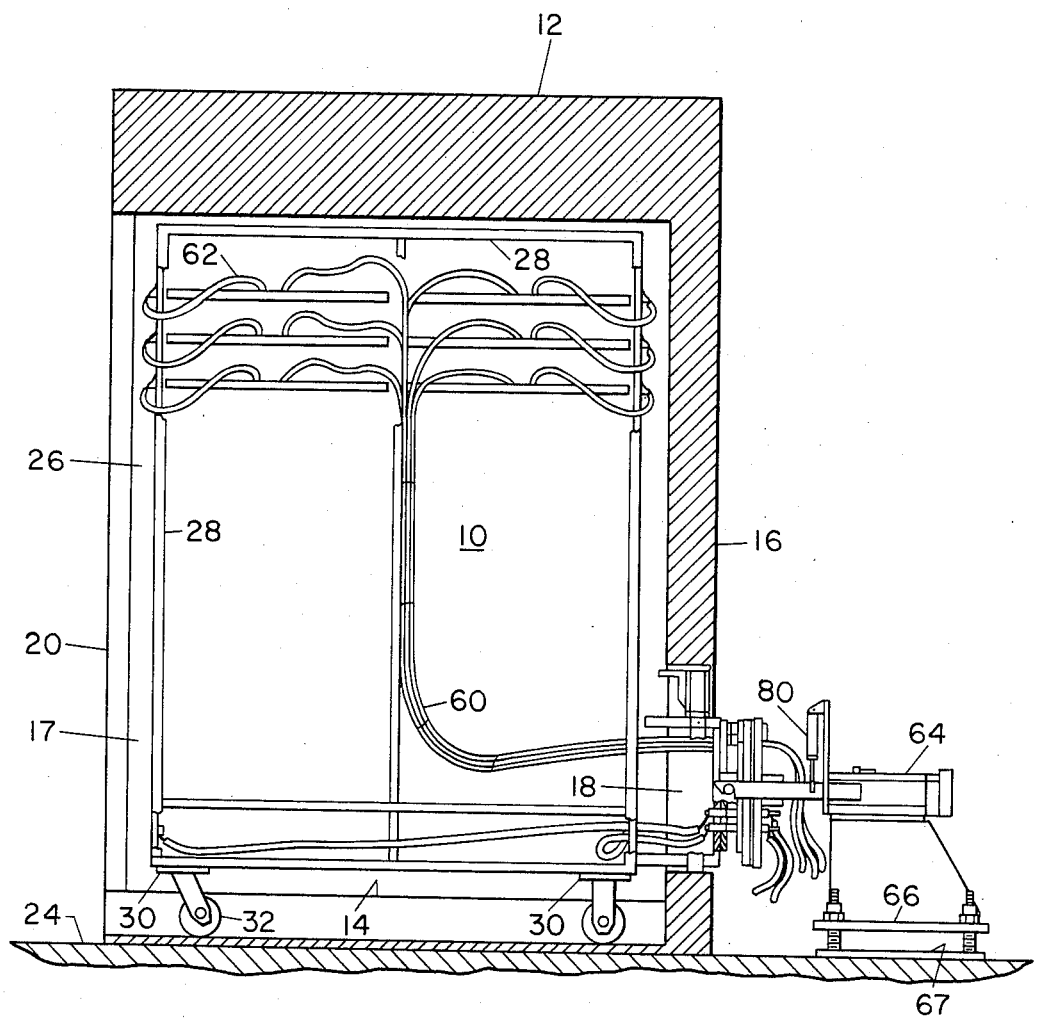
FIG. 1 is a cross sectional view of the system showing the cart positioned within the stress chamber, and the completed connections from the power connector to the bustle.
Figure 5:
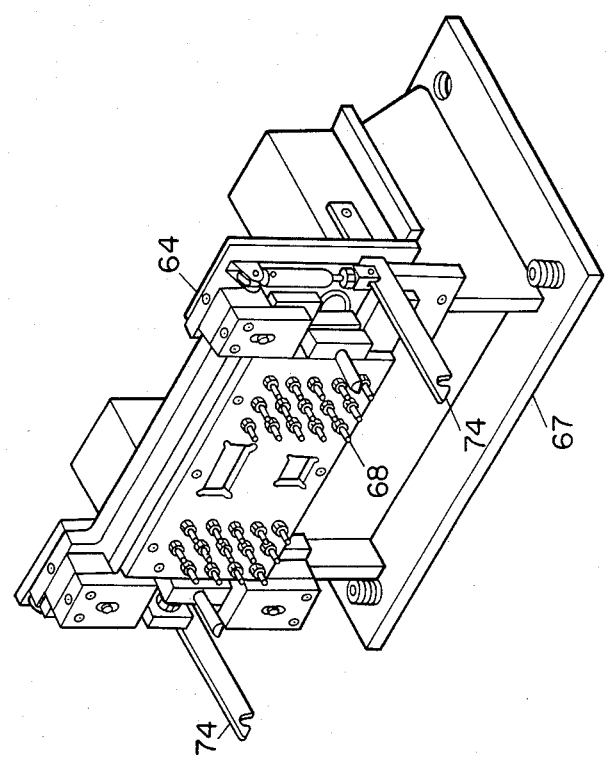
FIG. 5 is an orthogonal view of the power connector.

Referring to the drawings, and particularly to FIG. 1, there is shown an insulated chamber 10 having means (not illustrated) for controlling the chamber's interior temperature between specified limits. The chamber 10 is essentially a heat insulated room having a ceiling 12, a floor 14, a rear wall 16 and a pair of side walls 17. The rear wall 16 has a rectangular aperture 18 near the bottom. The front of the chamber is closed by a full width, full height insulated hinged door 20. The floor 14 is provided with a pair of recessed parallel spaced steel tracks 22. The entire chamber 10 is supported on an appropriate supporting structure 24 (the factory floor) by any suitable means.

Figure 3:
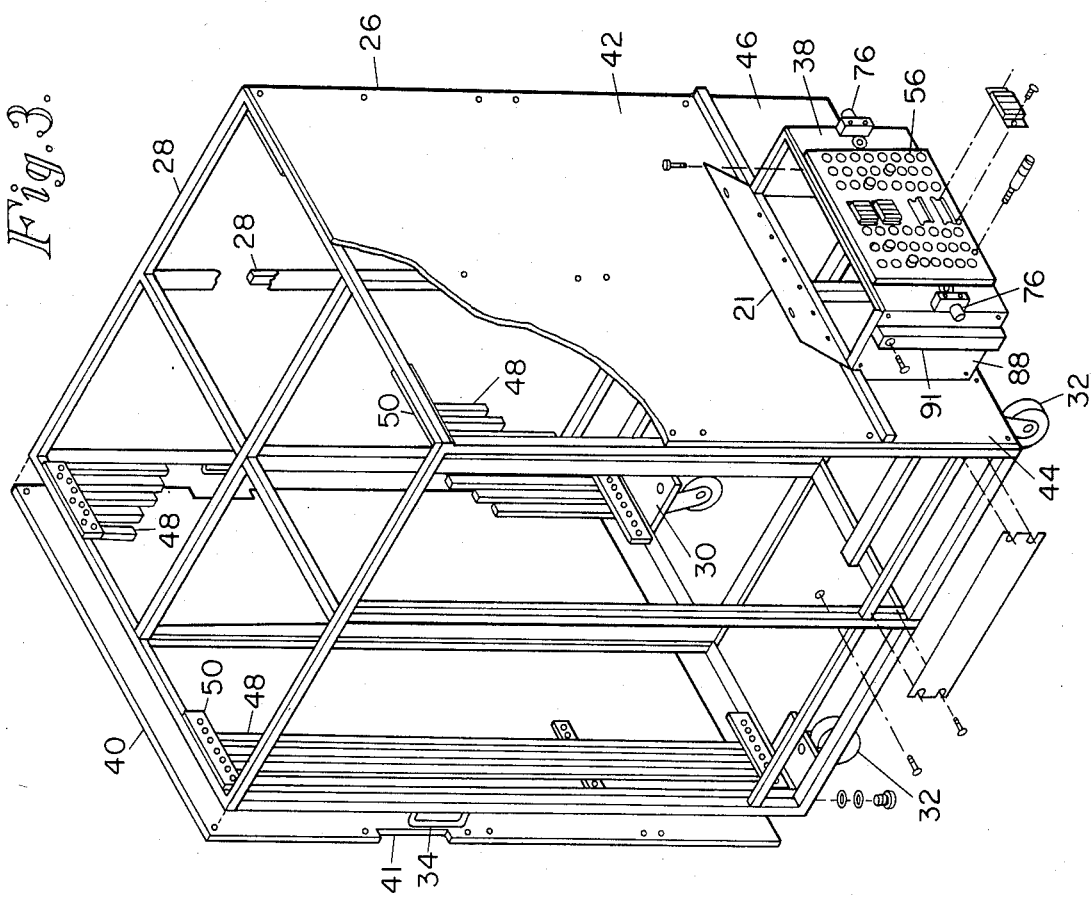
FIG. 3 is an orthogonal view of the cart standing alone with portions broken away.
Figure 4:
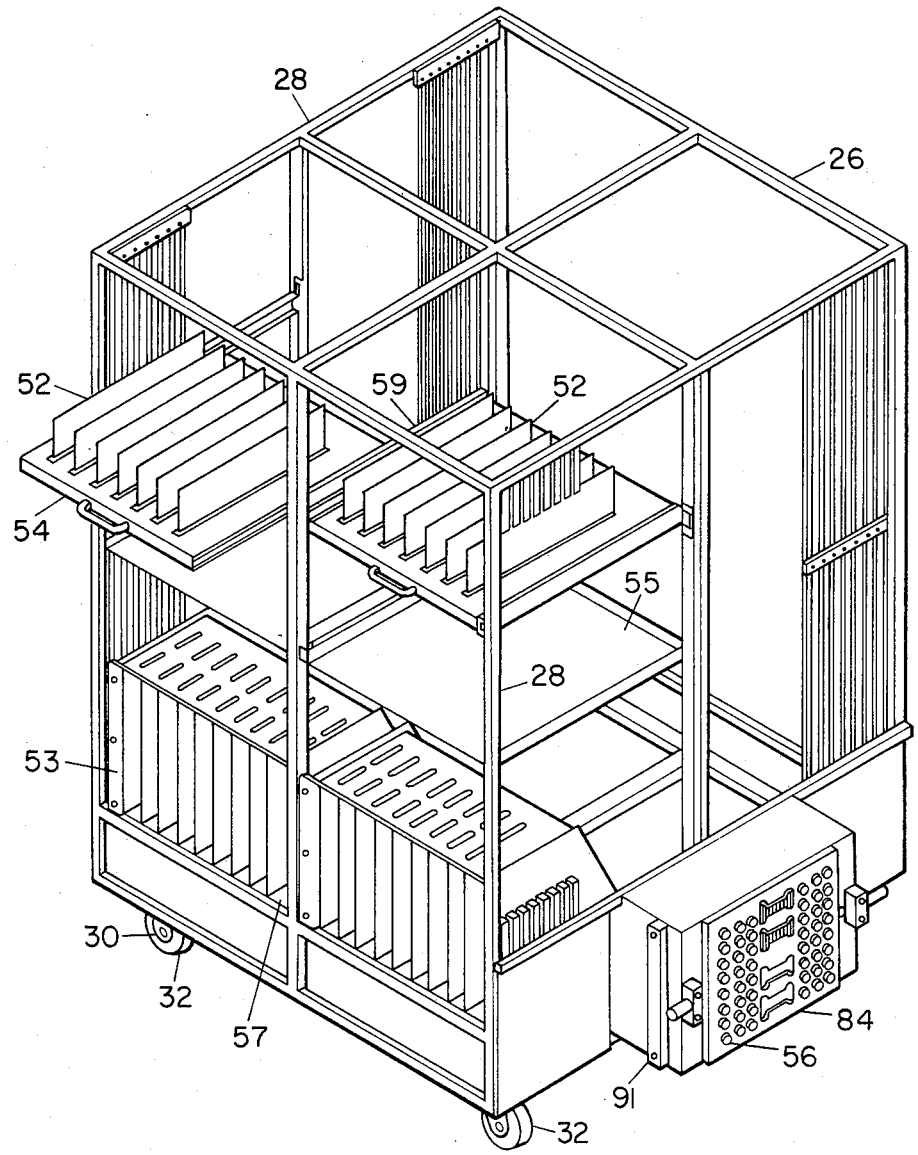
FIG. 4 is a view similar to FIG. 3 but with the outer shields of the cart removed to show different configurations for mounting various products.
Figure 6:
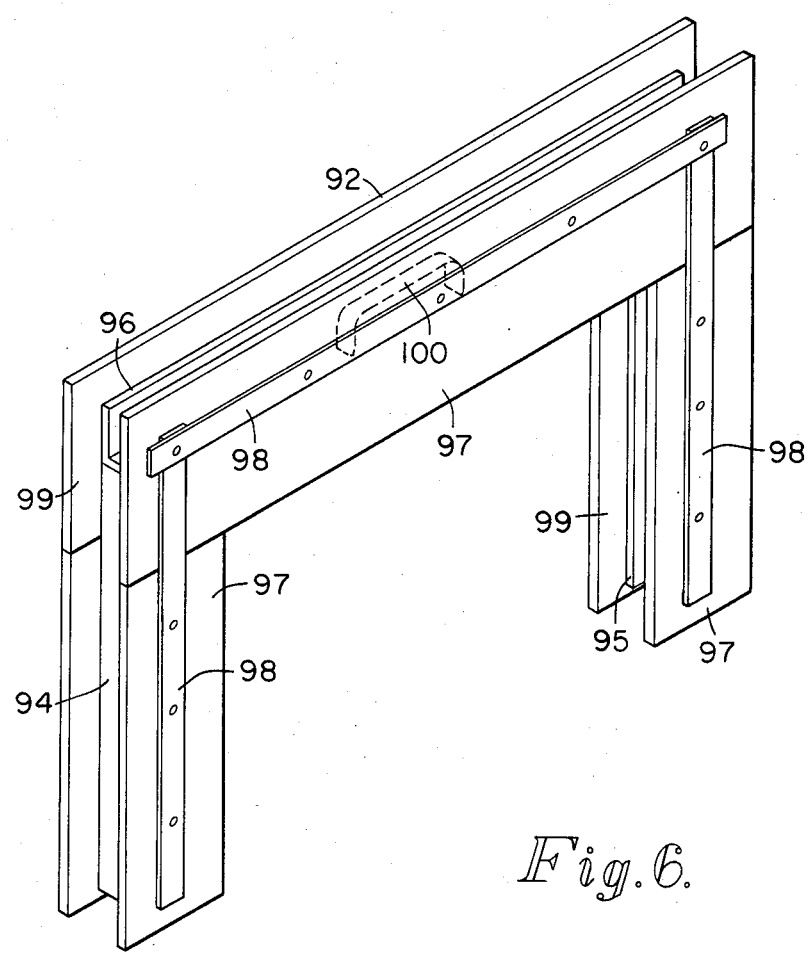
FIG. 6 is an orthogonal view of the seal.

The Cart 26, as seen in FIGS. 3 and 4, consists of a plurality of vertical and horizontal frame members 28 welded together to form a rigid rectangular structure which is supported by means of brackets 30 on four wheels 32 located at the bottom corners of the cart structure. An electrical bustle 38, hereinafter to be described in more detail, is secured to the rear frame members 28, and projects rearward from the cart structure. A poly carbonate shield 40, notched at 41 to permit the projection of the handles 34, is secured to the front of the cart structure. A similar shield, fabricated in three section 42, 44 and 46 to permit the projection of the bustle 38, is secured by any suitable means to the rear of the cart structure.

A plurality of vertical bus bars 48 are mounted inside the cart structure at each of four the corners. The bus bars 48 are secured between the top and bottom horizontal frame members 28 by means of insulators 50.

As seen in FIG. 4, a plurality of products shown by way of example as circuit boards 52 and 53 are positioned within the cart structure on three different types of supports 54, 55 and 57. The support 54 is a drawer carried by conventional drawer slides 59 secured to the frame members at appropriate heights, as required by the product size. Supports 55 are cookie sheet type shelves which are fixed to the frames 28 at appropriate heights to accommodate the particular product. The support 57 is a card cage in which the printed circuit boards are installed. The card cages are fixed to the vertical frames 28.

The bustle 38 supports a set of female connectors 56 to which electrical wires 58 and 60 are connected. The wires 58 are connected to respective bus bars 48, while the wires 60 are connected to selected output terminals, not shown, in the circuit boards 52 and 53, or other product being tested. Connections are also made by means of wires 62 from the bus bars 48 to selected input terminals of the circuit board 52 and 53.

When the cart 26 is rolled into the insulated chamber 10, the bustle 38 extends through the opening 18 in alignment with a power actuated device 64 consisting of a set of complementary male connectors 68. The device 64 is mounted on a base 67 which is fixed to the factory floor 24 in alignment with the opening 18 and bustle 38, so that when actuated, the plurality of complementary jack type connectors 68 are driven into the corresponding female connectors 56.

The power actuated device 64 is provided with a piston 70 fixedly supported on a platform 67 in driving relationship with the mounting board 72 for the jacks 68. A pair of latches 74 pivoted at 75 from the device 64 extends toward two pins 76 on the bustle. A bracket 77 provides a pivotal support for two vertically oriented pistons 80 which serve to drive the latches 74 into engagement and disengagement with the pins 76. The brackets 77 are provided with narrow slots through which the latches extend. The slots provide a guide for the latches in a horizontal plane, but permit vertical movement for locking and unlocking the latches 74 from the pins 76.

The bustle 38 consists of a rectangular enclosure having a rear wall 82, to which the insulated mounting board 84 for the female connectors 56 is secured. It is also provided with a fixed bottom wall 86, and fixed sidewalls 88. The top wall 89 is hinged at 90 to provide access to the bustle interior. The front of the bustle is open to the interior of the cart. The side walls 88 of the bustle are both provided with a vertical phenolic strip to provide guide rails 91 for the seal 92 described below.

The opening 18 in the chamber 10 is substantially larger than the bustle 38 so as to provide considerable clearance for the bustle, except at the bottom. To seal the space between the walls of the chamber 10 and the bustle the air seal 92 slides over the phenolic guides 91 and closes the gap between the wall and the bustle. In the embodiment of the invention as shown the seal consists of an inward facing U-shaped aluminum channel members 94 and 95 which provide the tracks that slide over and are snugly supported by the phenolic guides 91. A similar outward facing U-shaped channel member 96 bridges the members 94 and 95, to form a rigid rectangular three sided frame. Foam rubber pads 97 and 99 are secured to the outer faces of the channel members by means of straps 99. The foam rubber pads 97 and 99 extend beyond the gap to be filled, and therefore when the seal is seated on the bustle and the bustle is moved through the chamber opening, the extremities of the pads are forced down into a horizontal position, as shown in FIG. 1, and a very efficient air lock seal results.

A handle 100 is provided so that the seal is easily removable. Because the seal is removable, it enables ready access to the interior of the bustle through the hinged wall 89. In addition, it is usable with the bustles of other carts, and if the pads become worn, they are readily replaceable.

Having thus described an embodiment of this invention as reduced to practice, it will be understood that various modifications and adaptations will be available to persons skilled in the art. It is intended, therefore, that this invention be limited only by the appended claims as interpretted in the light of the prior art.

We claim:

1. In a system for environmentally stressing electronic components the combination comprising:

a heat insulated temperature controlled chamber having a substantially open front closed by a full width, full height front access door and having a rear wall with an aperture therein, said chamber having a pair of spaced parallel tracks in the floor, said tracks extending from said open front to said rear wall;

a cart for carrying electronic components to be stressed within said chamber, said cart having wheels carried by said tracks, said cart also having a plurality of adjustable shelves for supporting said components;

a bustle having a plurality of electrical connections selectively connectable to said components, said bustle being mounted on the rear of said cart and being aligned with said aperture in said rear wall, and projecting through said aperture when said cart is positioned within said chamber, said bustle having a cross section complementary to said aperture, and dimensioned to provide a gap between the wall surrounding said aperture and said bustle, said bustle having access means enabling access to said connectors from outside the rear wall of said chamber;

a seal mounted on said bustle for sealing the gap between said bustle and the surrounding wall;

a plurality of current carrying busses mounted on said cart, said busses being selectively connectable to components to be stressed and to selective connections in said bustle;

a complimentary connector positioned outside of said chamber in alignment with said bustle, said complimentary connector having connections mating with the connections in said bustle, electrical input currents being supplied to selected ones of said connections of said complementary connector, and electrical output signals being derivable from selected other ones of said connections.

2. The invention as defined in claim 1 wherein said seal comprises a frame removably engaging the periphery of said bustle, first and second spaced pads mounted around the periphery of said frame, said pads filling said gap when said bustle is positioned within said opening, said pads extending from said bustle a distance greater than said gap, whereby said pads are folded when the bustle is positioned in said gap, said bustle being rectangular in cross section and having two side walls and a top wall, said top wall being hinged to provide said access means;

and a vertical guide rail on each side wall, said rectangular frame being provided with complementary tracks engaging said guide rails.

3. A seal for sealing the gap between the rectangular bustle of a cart carrying electronic components to be stress tested within a heat insulated chamber, said bustle supporting a plurality of electrical connectors projecting through an opening in said heat insulated chamber, said seal comprising:

a frame removably engaging the periphery of said bustle, first and second spaced pads mounted around the periphery of said frame, said pads filling said gap when said bustle is positioned within said opening, said pads extending from said bustle a distance greater than said gap, whereby said pads are folded to provide an air lock when the bustle is positioned in said gap;

said bustle having a hinged top access wall and two side walls;

a vertical guide rail on each side wall, and complementary tracks on said rectangular frame said tracks engaging said guide rails.

* * * * *